(12) United States Patent
Zhang et al.

(10) Patent No.: US 12,494,350 B2
(45) Date of Patent: Dec. 9, 2025

(54) LOWER ELECTRODE ASSEMBLY AND PLASMA PROCESSING DEVICE

(71) Applicant: ADVANCED MICRO-FABRICATION EQUIPMENT INC. CHINA, Shanghai (CN)

(72) Inventors: Yichuan Zhang, Shanghai (CN); Rubin Ye, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 259 days.

(21) Appl. No.: 17/585,476

(22) Filed: Jan. 26, 2022

(65) Prior Publication Data
US 2022/0246406 A1    Aug. 4, 2022

(30) Foreign Application Priority Data
Feb. 1, 2021   (CN) .......................... 202110136824.1

(51) Int. Cl.
*H01J 37/32*  (2006.01)
*H01L 21/683*  (2006.01)

(52) U.S. Cl.
CPC .. *H01J 37/32568* (2013.01); *H01J 37/32495* (2013.01); *H01J 37/32715* (2013.01);
(Continued)

(58) Field of Classification Search
CPC ..................... H01L 21/6833; H01L 21/68735
See application file for complete search history.

(56) References Cited

U.S. PATENT DOCUMENTS 5,985,102 A * 11/1999 Leiphart ............... C23C 14/046
                                                                438/584
6,079,356 A    6/2000 Umotoy et al.
(Continued)

FOREIGN PATENT DOCUMENTS

CN        103794538 B      6/2016
CN        110473759 A     11/2019
(Continued)

*Primary Examiner* — Keath T Chen
(74) *Attorney, Agent, or Firm* — Womble Bond Dickinson (US) LLP

(57) ABSTRACT

The present disclosure provides a lower electrode assembly and a plasma processing device in which the lower electrode assembly is located. The lower electrode assembly includes a base, including a main part and a step part extending outwardly from the main part, the step part being provided with a screw hole; a dielectric ring, disposed on the step part around the main part, a groove being formed in a bottom of the dielectric ring, and an opening of the groove being able to cover an opening of the screw hole; and a screw, having a head being located in the groove. By forming the groove inside the dielectric ring at an outer edge of the base, the head of the screw fixing the base is arranged in the groove so as to reduce a diameter of the hole formed in the base, so that an edge of the screw hole can be completely covered by the dielectric ring, and since the dielectric ring is made of an insulating material, a technical effect of avoiding arcing at the edge of the screw hole can be achieved.

17 Claims, 3 Drawing Sheets

(52) U.S. Cl.
CPC .... *H01L 21/6833* (2013.01); *H01J 37/32082* (2013.01); *H01J 2237/334* (2013.01)

(56) References Cited

U.S. PATENT DOCUMENTS

| | | | | |
|---|---|---|---|---|
| 6,096,161 | A * | 8/2000 | Kim | H01J 37/32642 |
| | | | | 156/345.47 |
| 11,289,356 | B2 | 3/2022 | Hayashi | |
| 2002/0029745 | A1* | 3/2002 | Nagaiwa | H01L 21/67103 |
| | | | | 118/728 |
| 2005/0003600 | A1* | 1/2005 | Kasai | C23C 16/45521 |
| | | | | 257/E21.585 |
| 2008/0087382 | A1* | 4/2008 | Sugiyama | H01L 21/67069 |
| | | | | 156/345.51 |
| 2009/0294064 | A1* | 12/2009 | Nagayama | H01J 37/32623 |
| | | | | 156/345.39 |
| 2010/0058373 | A1* | 3/2010 | Aman | G11B 17/0282 |
| | | | | 720/604 |
| 2014/0209245 | A1* | 7/2014 | Yamamoto | H01L 21/6831 |
| | | | | 361/234 |
| 2014/0254061 | A1* | 9/2014 | Shiraiwa | H01L 21/6831 |
| | | | | 361/234 |
| 2017/0338140 | A1* | 11/2017 | Pape | H01J 37/32082 |
| 2020/0273680 | A1* | 8/2020 | Koiwa | C23C 16/4585 |
| 2021/0296098 | A1* | 9/2021 | Cho | H01L 21/67103 |
| 2022/0037127 | A1* | 2/2022 | Nakatani | H01L 21/67069 |

FOREIGN PATENT DOCUMENTS

| | | |
|---|---|---|
| JP | 2012149715 A | 8/2012 |
| TW | 202101525 A | 1/2021 |

\* cited by examiner

LOWER ELECTRODE ASSEMBLY AND PLASMA PROCESSING DEVICE

RELATED APPLICATIONS

The present application claims priority to and the benefit of Chinese Patent Application No. 202110136824.1, filed on Feb. 1, 2021, the disclosure of which is hereby incorporated by reference in its entirety.

TECHNICAL FIELD

The present disclosure relates to the technical field of plasma etching, and particularly relates to the technical field of a lower electrode assembly and a plasma processing device for preventing the lower electrode assembly from arcing at a high radio frequency power.

BACKGROUND

Micro-processing of semiconductor substrates is a well-known technique that can be used to manufacture, for example, semiconductors, flat panel displays, light emitting diodes (LEDs), solar cells, and the like. Plasma process is an important step in micro-processing manufacturing which is performed inside a reaction chamber, and process gas is input into the reaction chamber. A radio frequency source is coupled into the reaction chamber by inductance and/or capacitance to excite the process gas to form and maintain plasma. Inside the reaction chamber. A substrate is supported by a lower electrode assembly and fixed at a specific position by a certain chucking force, so as to ensure the fixing of the substrate in the manufacturing procedure of the process and have a stable yield.

The lower electrode assembly not only includes an electrostatic chuck fixing the substrate and a base supporting the electrostatic chuck, but also includes an edge ring assembly disposed around a periphery of the base, and the lower electrode assembly is used to control a temperature of the substrate, electric field distribution and the like, in addition to supporting and fixing the substrate in the technological process of processing the substrate.

In the prior art, the base is typically made of aluminum, and the material for a dielectric ring around the periphery of the base is usually ceramic; since thermal expansion coefficients of the two materials differ greatly, in order to ensure that the base operates in a large temperature range, a certain space needs to be provided between the dielectric ring and the base to accommodate thermal expansion and cold contraction of the base.

As the processing accuracy of the substrate increases, a higher radio frequency power applied into the reaction chamber. The high radio frequency power induces more arcing in the narrow space in the reaction chamber, which damages the base and its peripheral components and seriously threatens the operating stability and safety of the lower electrode assembly. Therefore, there is an urgent demand for a solution to meet the requirements of an ever-increasing RF power and substrate processing uniformity.

SUMMARY

In order to solve the above-mentioned technical problem, the present disclosure provides a lower electrode assembly, for bearing a processed substrate to be processed, including:

a base, including a main part and a step part extending outwardly from the main part, the step part being provided with a screw hole;

a dielectric ring, disposed on the step part around the main part, a groove being formed in a bottom of the dielectric ring, and an opening of the groove being able to cover an opening of the screw hole; and a screw, having a head being located in the groove.

Optionally, the dielectric ring is made of a ceramic material.

Optionally, an outer side of the base is coated with a protective layer.

Optionally, the protective layer is an alumina and/or yttria material layer, or a hard anodized layer.

Optionally, the groove is cylindrical, and an inner diameter of the groove is greater than an inner diameter of the screw hole.

Optionally, a washer is disposed below the head of the screw, and the washer is made of a dielectric material.

Optionally, the washer is located inside the groove.

Optionally, an insert cap is disposed above the head of the screw, and the insert cap is made of a dielectric material.

Optionally, a gap between the groove and the head of the screw is fully filled with the insert cap.

Optionally, a protective ring between the base and the dielectric ring is further included.

Optionally, the protective ring is made of a plasma etching resistant material.

Optionally, the protective ring is in a fluororubber or a perfluoro-rubber series.

Further, the present disclosure further discloses a plasma processing device which includes a vacuum processing chamber, the lower electrode assembly as described in any one of the above being disposed in the vacuum processing chamber.

The present disclosure has the advantages that the present disclosure provides the lower electrode assembly with high safety and the plasma processing device, the groove is formed inside the dielectric ring at the outer edge of the base, the head of the screw fixing the base is arranged in the groove so as to reduce a diameter of the screw hole in the base, so that an edge of the screw hole can be completely covered by the dielectric ring, and since the dielectric ring is made of the dielectric material, which prevents the screw hole from being exposed to a gap accommodating thermal expansion and cold contraction, such that a technical effect of avoiding occurrence of arcing at the edge of the screw hole can be achieved. The insulating washer is further disposed below the head of the screw for isolating the upper edge of the screw hole from contact with gas, so as to further improve a breakdown voltage. In addition, the insert cap is fitted over the head of the screw and is shaped to fill the gap between the screw and the groove. The insert cap is made of the insulating material and can prevent occurrence of arcing around the head of the metal screw.

BRIEF DESCRIPTION OF THE DRAWINGS

To describe the technical solutions in the embodiments of the present disclosure or in the existing technology more clearly, the following briefly describes the accompanying drawings required for describing the embodiments or the existing technology. Apparently, the accompanying drawings in the following description show merely some embodiments of the present disclosure, and a person of ordinary skill in the art may still derive other drawings from these accompanying drawings without creative efforts.

DETAILED DESCRIPTION

In order to make objects, technical solutions and advantages of embodiments of the present disclosure clearer, the technical solutions in the embodiments of the present disclosure are clearly and completely described below in conjunction with the accompanying drawings in the embodiments of the present disclosure, and it is apparent that the described embodiments are parts of embodiments rather than all embodiments of the present disclosure. Based on the embodiments of the present disclosure, all other embodiments obtained by a person of ordinary skill in the art without creative effort all fall within the scope of protection of the present disclosure.

Figure 1:
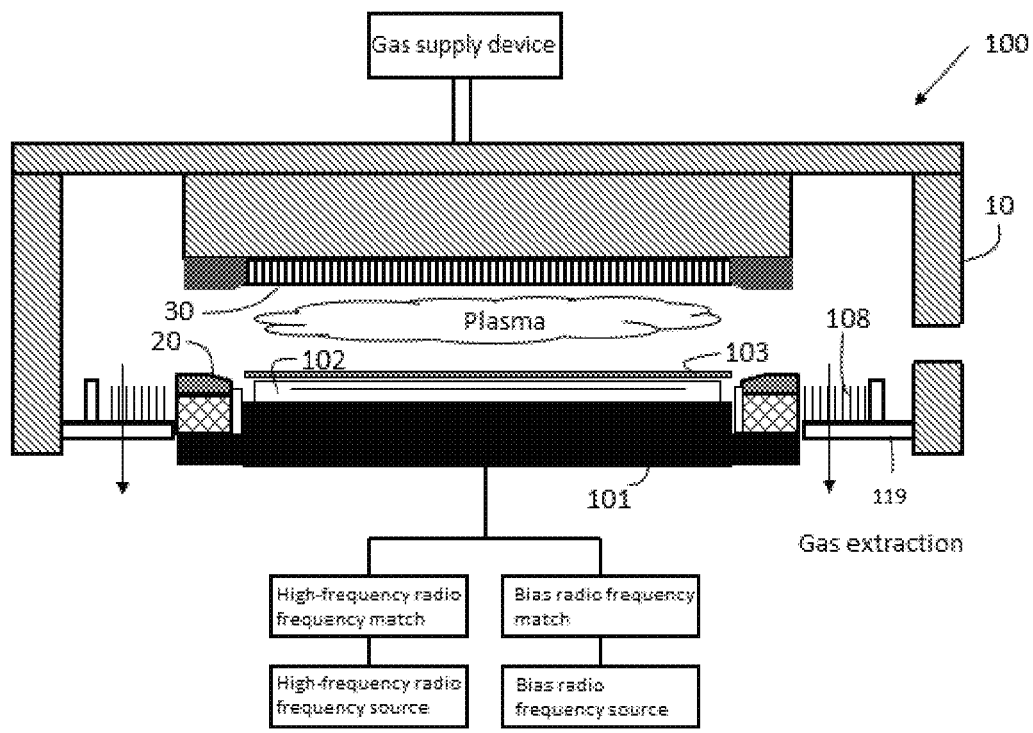
FIG. 1 shows a schematic structural diagram of a capacitive coupling plasma processing device.

FIG. 1 shows a schematic diagram of a capacitive coupling plasma processing device, including a vacuumable reaction chamber 100 defined by chamber wall 10. The reaction chamber 100 is used to process a substrate 103. A lower electrode assembly is included inside the reaction chamber and used for supporting the substrate while controlling factors affecting substrate processing such as a substrate temperature and an electric field. The lower electrode assembly includes a base 101 for carrying an electrostatic chuck 102, a temperature control device being disposed in the base 101 and used for achieving temperature control over the substrate above, and the electrostatic chuck 102 for supporting the substrate 103. A direct-current electrode is embedded in the electrostatic chuck, and connected to a high-voltage direct-current source below the base via the direct-current electrode, and after a high-voltage direct-current voltage is applied onto the direct-current electrode, direct-current adsorption is generated between the substrate and a supporting surface of the electrostatic chuck so as to fix the substrate. An edge ring assembly 20 is disposed around the base and a periphery of electrostatic chuck and used to adjust a temperature, electric field distribution, and the like in an edge region of the substrate. A plasma confinement ring 108 is disposed around the edge ring assembly 20, located between the edge ring assembly 20 and a side wall of the reaction chamber, and used to confine plasma in a reaction region while allowing gas to pass through. A grounding ring 119 is located below the plasma confinement ring, shields the electric field to avoid plasma leakage. A bias radio frequency source is included, which generally outputs a low-frequency (less than 2 Mhz) radio frequency power, typically 400 Khz. A bias radio frequency power is generally applied to the lower electrode assembly for controlling ions bombarding direction. The lower electrode assembly disclosed in the present disclosure may be used for the capacitive coupling plasma processing device as shown in FIG. 1.

In the capacitive coupling plasma processing device shown in FIG. 1, an upper electrode assembly is further included in addition to the lower electrode assembly, and the upper electrode assembly includes a gas shower head 30 for introducing process gas from a gas supply into the reaction chamber. A high-frequency radio frequency source applies a high-frequency radio frequency signal to at least one of the upper electrode assembly or the lower electrode assembly to form a radio frequency electric field between the upper electrode assembly and the lower electrode assembly to excite the process gas in the reaction chamber into plasma to process the substrate. The high-frequency radio frequency source outputs a radio frequency signal greater than 13 Mhz, typically 13.56, 27 or 60 Mhz, to facilitate ignition of the plasma.

Figure 2:
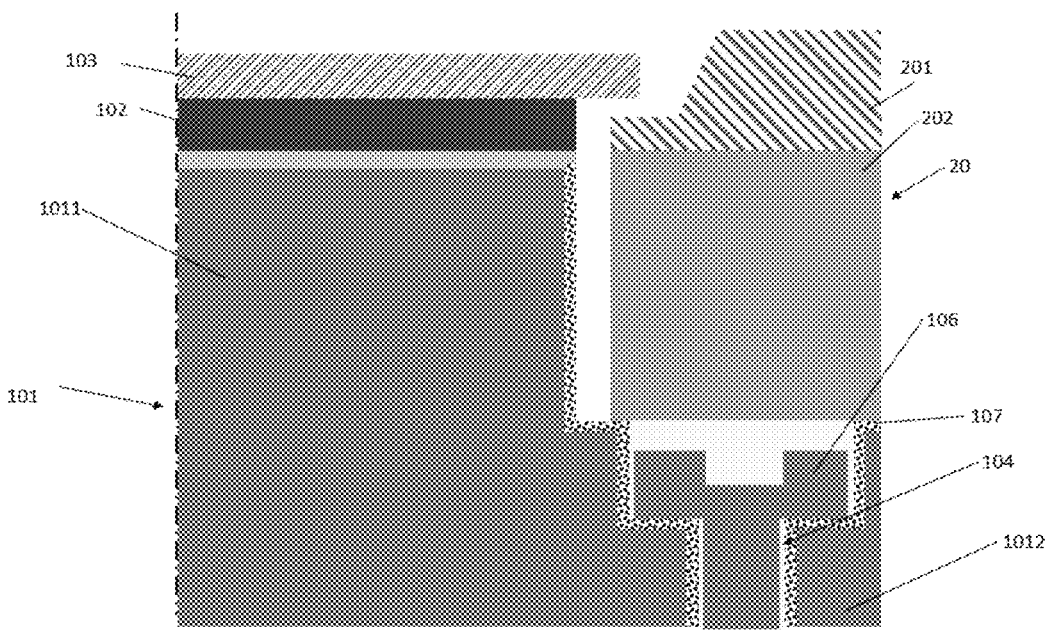
FIG. 2 shows a schematic partial diagram of a mounting structure of a lower electrode assembly.

FIG. 2 shows a schematic partial diagram of a lower electrode assembly. The lower electrode assembly includes: a focus ring 201, which is disposed around the base 101 and/or the electrostatic chuck 102 and the substrate 103, and is used to adjust the temperature, electric field distribution, and the like in the edge region of the substrate 103; and a dielectric ring 202 is disposed below the focus ring 201, and the dielectric ring 202 is used to maintain a potential difference between the focus ring 201 and the base 101 while adjusting a temperature of the focus ring 201.

A material of the base 101 is generally an electrically conductive metal material, such as aluminum, and the dielectric ring 202 around the base is generally made of a ceramic material, preferably a high thermal conductivity ceramic material, such as $Al_2O_3$. Since thermal expansion coefficients of the base 101 and the dielectric ring 202 are different, in order to avoid extrusion of parts due to thermal expansion, a certain gap needs to be provided between the dielectric ring 202 and the base 101 during mounting. As the processing accuracy of the substrate increases, a radio frequency power applied into the reaction chamber increases. A high radio frequency power will induce arcing in a narrow space in the reaction chamber, which damages the base and its peripheral components, and seriously threatens the operating stability and safety of the lower electrode assembly.

In the gap between the dielectric ring 202 and the base 101, a potential difference may be generated between the substrate 103 and the base 101. The higher the radio frequency power, the greater the potential difference. In the narrow space of the gap, a surface of the base is usually coated with a protective layer 107 to resist the erosion. In order to fix the base 101 on a mounting plate, a screw hole 104 is formed in a step part 1012, and to avoid the screw 106 obstructing the mounting of an edge ring 20, a cave should be set upon the screw hole, the cave has a diameter larger than that of the screw hole 104, due to a limitation by the space, an edge of the cave is too close to the gap between the dielectric ring 202 and the base 101, and the edge of the cave cannot be completely covered by the protective layer 107 due to a process limitation, thereby increasing a risk of arcing between an exposed edge of the cave and the substrate 103, and the arcing would damage the substrate and the base.

Figure 3:
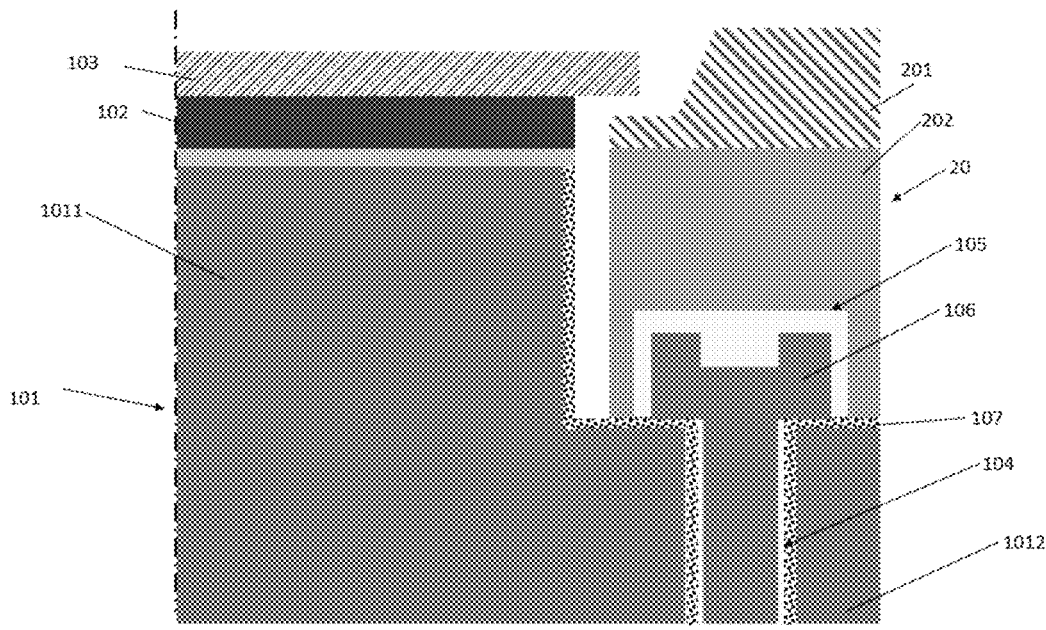
FIG. 3 shows a schematic partial structural diagram of a lower electrode assembly of an embodiment of the present disclosure.

FIG. 3 is a schematic diagram of an embodiment of the present disclosure. In this embodiment, the base 101 includes a main part 1011 and a step part 1012 extending outwardly from the main part 1011; the step portion 1012 is provided with a plurality of screw holes 104 uniformly disposed around the main part; and only one of the screw holes is illustrated now, and the base 101 is fixed to a mounting plate by cooperation of the screw 106 and the screw hole 104. The dielectric ring 202 disposed around the main part 1011 has a groove 105 in a bottom thereof for accommodating the head of the screw 106. The groove 105 may be cylindrical or in other shapes. In some embodiments, the groove 105 may be a circular ring around the base 101 to accommodate all the screws on the step part 1012 or one cylindrical groove may be disposed just above one of the screws. The dielectric ring 202 is compressed on the step part 1012 by self-gravity or an external force, so that the head of the screw 106 is inserted into the groove 105, and an opening of the groove 105 covers an opening of the screw hole 104. That is, the inner side wall of the groove 105 isolate between the screw hole 104 and the gap around the base; and by arranging the head of the screw 106 in the dielectric ring 202, it is possible to make a position not well covered by the protective layer 107, namely, the edge of the screw hole 104 significantly away from the gap between the dielectric ring 202 and the base 101. The surface of the base 101 exposed to the gap is completely covered by the protective layer 107, thereby significantly reducing the risk of occurrence of arcing in the gap. Furthermore, a breakdown path between the edge of the screw hole 104 and the substrate 103 is further obstructed by the dielectric ring 202, so that the dielectric ring 202 made of the ceramic material can also avoid arcing between the screw hole 104 and the substrate 103 even if the radio frequency power is increased. Optionally, the protective layer 107 may be made of a plasma etching resistant material, generally an alumina material, or an yttria material.

Figure 4:
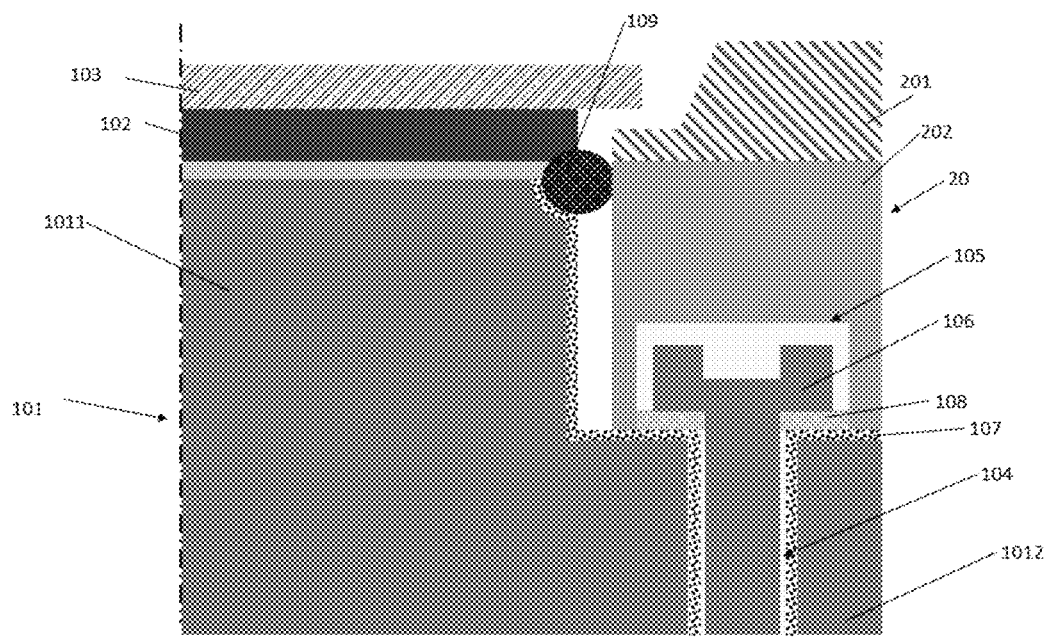
FIG. 4 shows a schematic partial structural diagram of a lower electrode assembly of another embodiment.

FIG. 4 is a schematic diagram of another embodiment of the present disclosure. In this embodiment, a difference from the above-mentioned embodiment lies in that a washer 108 is disposed below the head of the screw 16, the washer 108 can be compressed on the edge of the screw hole 104 by screwing in the screw, the washer 108 can be located in the groove 105, and uses an insulating material such as fluororubber or perfluoro-rubber. The dielectric ring 202 and the washer 108 are simultaneously on an arc path between the substrate 103 and the edge of the screw hole 104 for obstruction, so as to further improve the breakdown voltage. In some embodiments, a protective ring 109 surrounding outer wall of the base may also be disposed, and uses the fluororubber or perfluoro-rubber material, which can effectively reduce a probability of arcing and increase safe voltage threshold of the lower electrode assembly.

Figure 5:
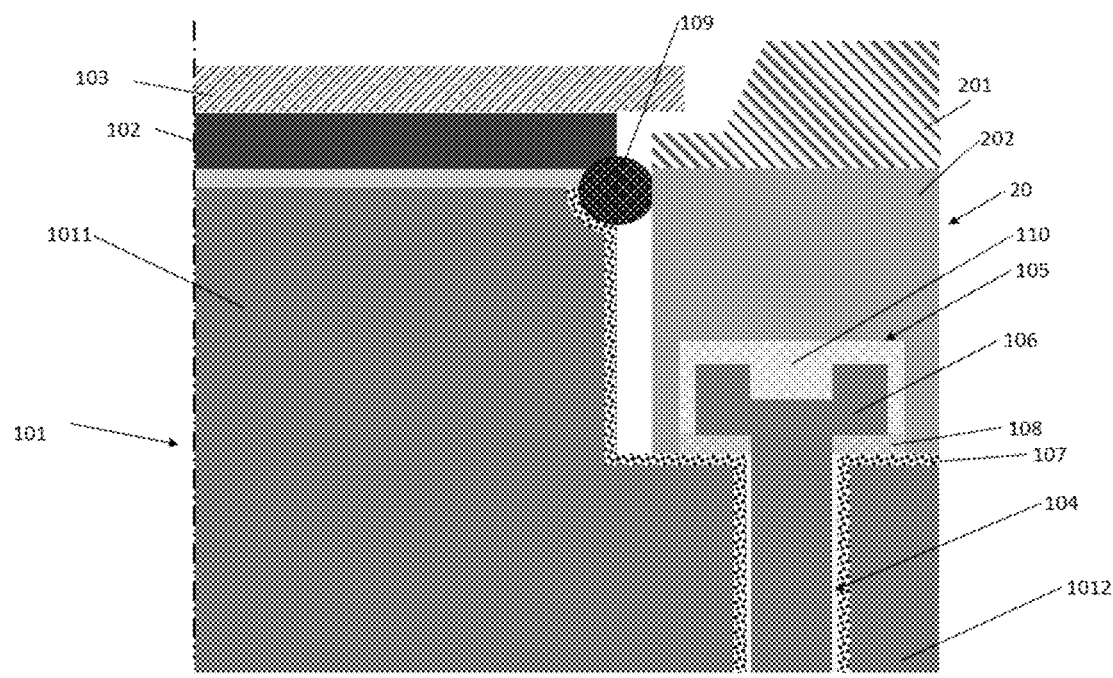
FIG. 5 shows a schematic partial structural diagram of a lower electrode assembly of another embodiment.

FIG. 5 is a schematic diagram of another embodiment of the present disclosure. In this embodiment, a difference from the above-mentioned embodiments lies in that an insert cap 110 is disposed above the head of the screw 106 to fill the space between the head of the screw 106 and the groove 105, thereby constituting a narrow space prone to arcing occurrence because gas may be trapped in the space, and the groove 105 may be optionally shaped to conform to the head of the screw 106, but it requires high machining conditions. In order to enhance insulativity around the screw and reduce the machining difficulty of the groove, in this embodiment, the groove 105 is in a shape of a cylinder with a diameter larger than that of the head of the screw hole 104, the insert cap 110 can cover its top after the screw 106 is screwed, and finally the dielectric ring 202 is mounted. The dielectric ring 202 can be well combined with the insert cap 110 by means of an external force, so as to greatly eliminate air in the groove 105. The insert cap 110 may be mounted into the groove first, and cover the head of the screw 106 together with the mounting of the dielectric ring 202. The insert cap 110 may use an insulating material, such as ceramic and rubber to comprehensively reduce the risk of arcing around the screw hole 104 in the lower electrode assembly.

Optionally, a thermally conductive layer is disposed between the focus ring 201 and the dielectric ring 202, and/or a thermally conductive layer is disposed between the dielectric ring 202 and the base 101 to increase the conductivity to a temperature of the focus ring 201. In other embodiments, the dielectric ring 202 may also be disposed above other supporting parts capable of independently controlling temperature to achieve the independent temperature control over the focus ring 201 different from the substrate 103.

Figure 6:
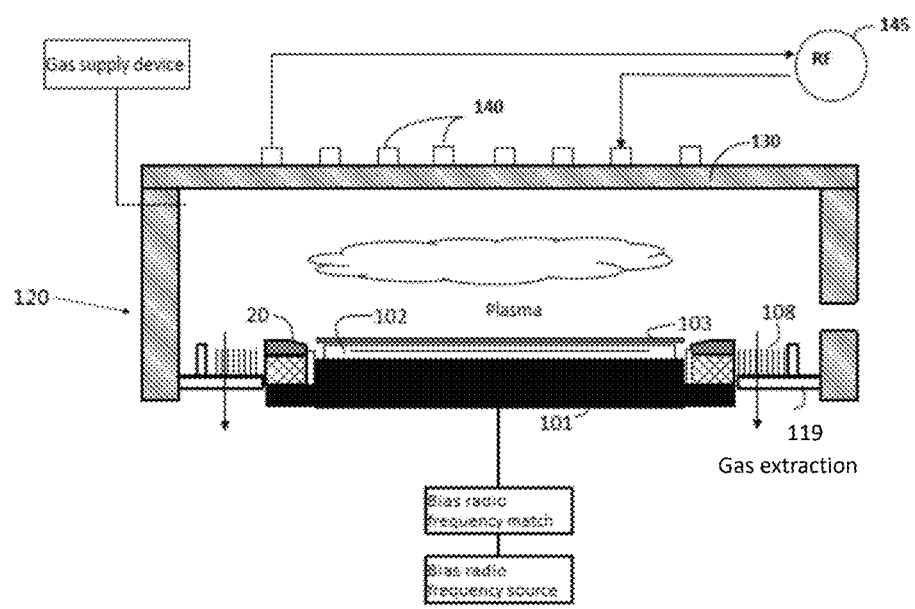
FIG. 6 shows a schematic structural diagram of an inductive coupling plasma processing device.

The lower electrode assembly described above can also be used in an inductive coupling plasma processing device as shown in FIG. 6. In this embodiment, the lower electrode assembly has a structure as described above and will not be described in detail herein. In addition, a dielectric window 130 is provided above the reaction chamber, an inductive coil 140 is disposed above the dielectric window, a high-frequency radio frequency source 145 applies a radio frequency signal to the inductive coil 140, and the inductive coil 140 generates an alternating magnetic field to induct an alternating electric field in the reaction chamber to dissociate the process gas injected into the reaction chamber. In this embodiment, the process gas may be injected into the reaction chamber from the side wall of the reaction chamber, or a gas injection port may also be provided in the dielectric window to accommodate the process gas which enters. A bias radio frequency source is applied to the lower electrode assembly through a bias radio frequency match for controlling energy distribution of the plasma.

The present disclosure provides the lower electrode assembly with high safety. The groove is formed inside the dielectric ring surround the base, the head of the screw fixing the base is arranged in the groove so as to reduce a diameter of the screw hole in the base, so that an edge of the screw hole can be completely covered by the dielectric ring, and since the dielectric ring is made of the dielectric material, a technical effect of avoiding occurrence of arcing at the edge of the screw hole can be achieved. The insulating washer is further disposed below the head of the screw for isolating the upper edge of the screw hole from contact with gas, so as to further improve a breakdown voltage. In addition, the insert cap is fitted over the head of the screw and is shaped to fill the gap between the screw and the groove. The insert cap is made of the insulating material and can prevent occurrence of arcing around the head of the metal screw.

The lower electrode assembly disclosed in the present disclosure is not limited to application to the plasma processing devices in the above two embodiments, and may also be applied in other plasma processing devices, which will not be described in detail herein.

Although the content of the present disclosure has been described in detail by means of the above-mentioned preferred embodiments, it should be recognized that the above description should not be regarded as a limitation to the present disclosure. Various modifications and substitutions to the present disclosure will become apparent to those skilled in the art upon reading the above-mentioned content. Therefore, the scope of protection of the present disclosure should be defined by the appended claims.

What is claimed is:

1. A lower electrode assembly, for supporting a substrate to be processed, comprising:
   an electrostatic chuck;
   a base to support the electrostatic chuck, including a main part and a step part extending outwardly from the main part, the step part being provided with a screw hole;

a dielectric ring, disposed on the step part around the main part and leaving a first gap between the main part and the dielectric ring, a groove being formed in a bottom of the dielectric ring, and an opening of the groove being able to cover an opening of the screw hole;

a focus ring disposed on a top of the dielectric ring;

a screw, having a head being located in the groove, wherein an insert cap is disposed directly on a top of the head of the screw to fill a second gap between the head of the screw and the groove, and wherein the insert cap covers a top surface and a side surface of the head of the screw;

a washer made of insulating fluororubber or insulating perfluoro-rubber is located inside the groove below the head of the screw;

a protective ring surrounding an outer wall of the base and positioned in the first gap between the base and the dielectric ring, wherein the protective ring is in touch with the base, the electrostatic chuck and above a bottom of the focus ring, the protective ring being at least partially in the first gap; and a protective layer disposed on an outer side of the base and extending into the screw hole.

2. The lower electrode assembly according to claim 1, wherein the dielectric ring is made of a ceramic material.

3. The lower electrode assembly according to claim 1, wherein the protective layer is an alumina and/or yttria material layer, or a hard anodized layer.

4. The lower electrode assembly according to claim 1, wherein the groove is cylindrical, and an inner diameter of the groove is greater than an inner diameter of the screw hole.

5. The lower electrode assembly according to claim 1, wherein the washer is located inside the groove.

6. The lower electrode assembly according to claim 1, wherein the insert cap is made of a dielectric material.

7. The lower electrode assembly according to claim 6, wherein a second gap between the groove and the head of the screw is filled with the insert cap.

8. The lower electrode assembly according to claim 1, wherein the protective ring is made of a plasma etching resistant material.

9. The lower electrode assembly according to claim 1, wherein the protective ring is of a fluororubber or a perfluoro rubber series.

10. A plasma processing device, comprising:
a lower electrode assembly, for supporting a substrate to be processed, comprising:
an electrostatic chuck;
a base to support the electrostatic chuck, including a main part and a step part extending outwardly from the main part, the step part being provided with a screw hole;
a dielectric ring, disposed on the step part around the main part and leaving a first gap between the main part and the dielectric ring, a groove being formed in a bottom of the dielectric ring, and an opening of the groove being able to cover an opening of the screw hole;
a focus ring disposed on a top of the dielectric ring;
a screw, having a head being located in the groove, wherein an insert cap is disposed directly on a top of the head of the screw to fill a second gap between the head of the screw and the groove, and wherein the insert cap covers a top surface and a side surface of the head of the screw;
a washer made of insulating fluororubber or insulating perfluoro-rubber is located inside the groove below the head of the screw;
a protective ring surrounding an outer wall of the base and positioned in the first gap between the base and the dielectric ring, wherein the protective ring is in touch with the base, the electrostatic chuck and above a bottom of the focus ring, the protective ring being at least partially in the first gap; and
a protective layer disposed on an outer side of the base and extending into the screw hole; and
a vacuum processing chamber, wherein the lower electrode assembly is disposed in the vacuum processing chamber.

11. The plasma processing device according to claim 10, wherein the dielectric ring is made of a ceramic material.

12. The plasma processing device according to claim 10, wherein the protective layer is an alumina and/or yttria material layer, or a hard anodized layer.

13. The plasma processing device according to claim 10, wherein the groove is cylindrical, and an inner diameter of the groove is greater than an inner diameter of the screw hole.

14. The plasma processing device according to claim 10, wherein the washer is located inside the groove.

15. The plasma processing device according to claim 10, wherein the insert cap is made of a dielectric material.

16. The plasma processing device according to claim 15, wherein a second gap between the groove and the head of the screw is filled with the insert cap.

17. The plasma processing device according to claim 10, the protective ring is made of a plasma etching resistant material.

* * * * *